United States Patent
Høyerby

(10) Patent No.: US 10,511,263 B2
(45) Date of Patent: Dec. 17, 2019

(54) CLASS D AUDIO AMPLIFIER WITH ADJUSTABLE GATE DRIVE

(71) Applicant: Infineon Technologies Austria AG, Villach (AT)

(72) Inventor: Mikkel Høyerby, Copenhagen SV (DK)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/976,561

(22) Filed: May 10, 2018

(65) Prior Publication Data

US 2018/0331660 A1 Nov. 15, 2018

(30) Foreign Application Priority Data

May 11, 2017 (EP) ..................................... 17170697

(51) Int. Cl.
*H03F 1/02* (2006.01)
*H03F 3/185* (2006.01)
*H03F 3/217* (2006.01)

(52) U.S. Cl.
CPC ........... *H03F 1/0255* (2013.01); *H03F 3/185* (2013.01); *H03F 3/2171* (2013.01); *H03F 3/2173* (2013.01); *H03F 2200/03* (2013.01); *H03F 2200/171* (2013.01); *H03F 2200/18* (2013.01); *H03F 2200/267* (2013.01); *H03F 2200/333* (2013.01); *H03F 2200/351* (2013.01)

(58) Field of Classification Search
CPC .................................................... H03F 1/0255
See application file for complete search history.

(56) References Cited

U.S. PATENT DOCUMENTS

| 6,388,514 B1* | 5/2002 | King ..................... H03F 1/0222 330/10 |
|---|---|---|
| 7,315,204 B2 | 1/2008 | Seven |
| 7,394,315 B2 | 7/2008 | Honda |
| 2004/0130923 A1 | 7/2004 | Yin Ho et al. |
| 2005/0151585 A1* | 7/2005 | Honda .................... H03F 1/305 330/10 |
| 2006/0250183 A1 | 11/2006 | Zhao et al. |
| 2007/0071086 A1 | 3/2007 | Botti et al. |
| 2009/0160547 A1* | 6/2009 | Shankar .................. H03F 3/217 330/10 |

(Continued)

FOREIGN PATENT DOCUMENTS

| EP | 1517438 A1 | 3/2005 |
|---|---|---|
| WO | 2012055968 A1 | 5/2012 |

*Primary Examiner* — Patricia T Nguyen
(74) *Attorney, Agent, or Firm* — Murphy, Bilak & Homiller, PLLC

(57) ABSTRACT

A class D audio amplifier includes a modulator for receipt of an audio signal and converting the audio signal into a modulated audio signal having a predetermined carrier frequency. The class D audio amplifier additionally includes an output stage having a plurality of power transistors coupled in cascade between a first DC supply voltage and a second DC supply voltage, and a plurality of gate drivers configured to generate respective modulated gate drive signals to the plurality of power transistors. A controller is configured to adjust a level of a first modulated gate drive signal applied to a first power transistor of the output stage based on a level of the audio signal.

20 Claims, 5 Drawing Sheets

(56) References Cited

U.S. PATENT DOCUMENTS

| | | | | |
|---|---|---|---|---|
| 2013/0049718 A1* | 2/2013 | Berkhout | ............... | H03F 1/52 323/271 |
| 2015/0288335 A1* | 10/2015 | Hoyerby | ............... | H03F 3/217 330/251 |
| 2017/0250654 A1* | 8/2017 | Cope | ............... | H03F 3/185 |

* cited by examiner

CLASS D AUDIO AMPLIFIER WITH ADJUSTABLE GATE DRIVE

BACKGROUND

Class D audio amplifiers are well-known and widely recognized to provide energy efficient audio drive of a loudspeaker load by switching a modulated audio signal e.g. pulse width modulated (PWM) or pulse density modulated (PDM), across the loudspeaker load. Class D audio amplifiers typically comprise an H-bridge driver with a pair of output terminals coupled to respective sides or terminals of the loudspeaker load to apply an oppositely phased pulse width modulated or pulse density modulated audio signals across the loudspeaker. Several modulation schemes for pulse width modulated audio signals have been utilized in prior art PWM based class D amplifiers. In so-called AD modulation, the pulse width modulated audio signal at each output terminal or node of the H-bridge is switched between, or toggles between, two different levels in opposite phase. The two different levels typically correspond to the upper and lower power supply rails, respectively, such as the positive and negative DC voltage supplies of the output stage. In so-called BD modulation, the pulse width modulated signal across the loudspeaker load is alternatingly switched between three levels of which two levels correspond to the above-mentioned upper and lower DC power supplies while the third level is zero that is obtained by simultaneously pulling both terminals of the loudspeaker load to one of the DC power supply rails. In multi-level PWM modulation as described in the applicant's co-pending patent application PCT/EP2011/068873, a third supply voltage level, often a set to a mid-supply level between the positive and negative DC supply rails, is applied to output node(s) of the output driver such that for example a 3-level or 5-level pulse width modulated signal can be applied across the loudspeaker load by an appropriately configured output driver.

However, there is a continued need in the art for reducing the power consumption of class D audio amplifiers, in particular at small audio output levels and quiescent operation, to prolong battery lifetime of portable audio equipment, reduce heat dissipation etc. At small output signal levels, the capacitive switching losses of the output transistors of the output or power stage can represent a significant portion of the total power consumption of the class D audio amplifiers and therefore render the overall power efficiency sub-optimal under these operating conditions.

SUMMARY

A first aspect relates to a class D audio amplifier that comprises: an input node or terminal for receipt of an audio signal; a modulator configured for receipt of the audio signal and converting the audio signal into a modulated audio signal having a predetermined carrier or modulation frequency; an output stage comprising a plurality of power transistors coupled in cascade between a first DC supply voltage (Pvdd) and a second DC supply voltage (Pvss); and a plurality of gate drivers comprising respective inputs coupled to the modulated audio signal and configured to generate respective modulated gate drive signals to the plurality of power transistors for repeatedly switching each power transistor between a conducting state and a non-conducting state. The class D audio amplifier additionally comprises a controller configured to determine a level of the audio signal and at least adjusting a level, or voltage, of a first modulated gate drive signal of a first power transistor of the output stage based on the determined level of the audio signal.

The class D audio amplifier may comprise 2-level class AD or BD pulse density modulation (PDM) or two-level or multilevel pulse width modulation (PWM) in various output stage topologies such as H-bridge topology or single-ended topology.

The DC supply voltage, i.e. the difference between the first and second DC supply voltages, of the class D audio amplifier may be lie between 5 Volt and 120 Volt. The DC supply voltage may be provided as a unipolar or bipolar DC voltage for example +40 Volt or +/−20 Volt relative to a ground reference, GND.

The level, or voltage, of the first modulated gate drive signal may for example be represented by a peak voltage, peak-to-peak voltage, average voltage, RMS voltage etc. of the first modulated gate drive signal at a particular duty cycle of the first modulated gate drive signal.

The controller may be a relatively simple digital circuit based on combinational logic operating asynchronously to any clock signal of the class D audio amplifier. In this embodiment the controller may operate according to a self-timed mechanism and comprise a handful of appropriately configured active and passive components and gates to determine the level of the audio signal and adjust the voltage of the first modulated gate drive signal. However, other embodiments of the controller may comprise clocked sequential logic operating synchronously to a master or other system clock signal of the class D audio amplifier. In the latter embodiment, the controller may for example comprise programmable logic circuitry or a software programmable or hard-wired Digital Signal Processor (DSP) or general-purpose microprocessor.

The output stage comprises at least two cascaded power transistors such as four, six or eight cascaded power transistors. The plurality of cascaded power transistors, of the output stage, preferably comprise at least one N-channel field effect transistor such as an NMOS, LDNMOS or IGBT deposited on semiconductor substrate such as Silicon, Gallium Nitride or Silicon Carbide. In certain embodiments of the output stage all power transistors are embodied as N-type MOS transistors. In alternative embodiments, at least the power transistor(s) coupled in cascade between the output node and the first, or highest, DC supply voltage (Pvdd) are P-type MOS transistor(s). Hence, eliminating the need to drive the gate terminals of the P-type MOS transistor(s) to a DC voltage above the first DC supply voltage.

The frequency of the first modulated gate drive signal or drive voltage, and of additional modulated gate drive signal(s) of additional power transistor(s) of the output stage, may lie between 100 kHz and 10 MHz, such between 250 kHz and 2 MHz. The frequency of the first modulated gate drive signal will often correspond to a switching frequency of the class D audio amplifier. The switching frequency may depend on factors such as the selected type of modulation, e.g. pulse width modulation (PWM), pulse density modulation (PDM) or space vector modulation (SVM), and various performance metrics of the class D amplifier. Each power transistor of the output stage may therefore be switched between its conducting state and non-conducting state at the switching frequency of the audio amplifier which leads to considerable power dissipation in various parasitic capacitances and resistances of the power transistors, in particular to power losses by charging and discharging the respective gate capacitances of the power transistors. The latter capacitive power losses of output transistors of prior art class D audio amplifiers remain largely constant independent of the level of the audio signal. This is caused by a constant level, e.g. expressed as peak-to-peak voltage, of the modulated gate drive signals of the power transistors of the output stage. Hence, a significant portion of the total power consumption of the class D audio amplifier is incurred by the capacitive power losses associated with charging and discharging gate capacitances of the power transistors at small levels of the audio signal where power delivered to the loudspeaker is small. This mechanism markedly reduces the power conversion efficiency of the class D audio amplifier at small audio levels.

This undesirable reduction of the power conversion efficiency of prior art class D audio amplifiers at small audio levels is prevented, or at least markedly reduced, by class D audio amplifiers in accordance with the embodiments described herein. The adjustable property of the first modulated gate drive signal, which may be adjusted between at least the first and second levels, depending on the level of the audio signal allows the controller to trade on-resistance of the first power transistor against capacitive power dissipation therein. Hence, the highest level of the first modulated gate drive signal may correspond to a gate source voltage 3 V-8 V above the threshold voltage of the first power transistor when the audio signal level is high and the output current through the power transistor, or transistors, likewise high. The high voltage of the modulated gate drive signal leads to a small output resistance of the class D audio and leads to power efficient driving of the loudspeaker load, because resistive power losses in the power transistor, or transistors, are minimized by the relatively small on-resistance—at least to the extent possible for the particular type and physical dimensions of the power transistor or transistors. Conversely, at relatively low or small voltages or amplitudes of the modulated gate drive signal, for example between one-third and one-fifth of the high gate-source voltage mentioned above, the charging losses associated with the gate driver's repeated charging and discharging of the gate capacitance(s) of the power transistor(s) are significantly reduced. While this reduction of the gate charging losses comes at the expense of higher on-resistance(s) of the power transistor(s), and hence higher output resistance of the class D audio amplifier, this may have little impact on the total power loss of the class D amplifier. The small impact is caused by the relatively small output current(s) through the power transistor(s) at low audio signal levels.

The controller may therefore be configured to increase the voltage, or level, of the first modulated gate drive signal for increasing level of the audio signal. Several different mechanisms may be applied by the controller to achieve this effect. The controller may be configured to stepwise increase, or gradually increase, the level or voltage of the first modulated gate drive signal at increasing level of the audio signal. The stepwise level increase of the first modulated gate drive signal may be based on a comparison between the level of the audio signal and a signal level threshold, or several signal level thresholds, such that the voltage of the first modulated gate drive signal is increased at the crossing of each signal level threshold. Hence, one embodiment of the controller is configured to compare the determined level of the audio signal to a signal level threshold; and select a first level of the first modulated gate drive signal if the level of the audio signal is smaller than the signal level threshold, or select a second level of the first modulated gate drive signal if the level of the audio signal is larger than the signal level threshold; wherein the second level is larger than the first level. The first level and second level may each be represented by a peak-peak voltage of the first modulated gate drive signal. The skilled person will understand that the first modulated gate drive signal may be applied across the gate and source nodes or terminals of the first power transistor. Hence, one or several of the gate drivers may connected to, and driving, high-side arranged power transistors in the output stage topology as discussed in additional detail below with reference to the appended drawings.

The first and second levels of the first modulated gate drive signal may be fixed by respective DC references voltages that each may be generated by the first gate driver or inputted to the first gate driver from a suitable external DC voltage source or supply. According one such embodiment, the first gate driver comprises a first DC reference voltage configured to set the second level of the first modulated gate drive signal and a first DC reference voltage generator. The first DC reference voltage generator comprises a first threshold detector configured to estimate a threshold voltage of the first power transistor and further configured to derive a second DC reference voltage from a difference between the first DC reference voltage and the estimated threshold voltage.

The first DC reference voltage generator is preferably configured to: estimating a first overdrive voltage of the first power transistor from the difference between the first DC reference voltage and the estimated threshold voltage and determining a predetermined fraction of the first overdrive voltage. The predetermined fraction of the first overdrive voltage is added to the estimated threshold voltage of the first power transistor. A second DC reference voltage is thereafter derived from said predetermined fraction of the first overdrive voltage and the estimated threshold voltage.

The accuracy of the threshold voltage estimated by the first threshold detector can be improved by utilizing a test transistor of the same type as the first power transistor, because this feature ensures that electrical characteristics, in particular the threshold voltages, of the first power transistor and the test transistor are tracking over semiconductor process variations and temperature changes as discussed in additional detail below with reference to the appended drawings. One such embodiment of the first threshold detector comprises a test transistor of a same type as the first power transistor, said first threshold detector being configured to: intermittently, or continuously, apply a test current to a diode-coupled test transistor; and estimate the threshold voltage of the first power transistor from a voltage drop across the diode-coupled test transistor. The voltage drop across the diode-coupled test transistor may be stored or held on a capacitive element, e.g. capacitor, and read by the controller or sampled and encoded by the controller via an analogue-to-digital converter. The voltage drop across the diode-coupled test transistor may be used as the estimate of the threshold voltage.

The first gate driver may comprise a first inverter, or first buffer, connected between gate and source terminals of the first power transistor to apply the first modulated gate drive signal thereto; wherein a power supply voltage of the first inverter or buffer is selectively connectable to the first DC reference voltage and second DC reference voltage in accordance with a mode control signal. The first inverter, or buffer, can be viewed as an inverter or buffer structure possessing a programmable or adjustable power supply voltage where the programmable power supply voltage for example can be switched between the first and second DC reference voltages by the controller—for example via a programming line or interface as discussed in additional detail below with reference to the appended drawings.

The plurality of power transistors of the output stage may exclusively consist of N-type MOS transistors in some embodiments while alternative embodiments at least comprises a second power transistor, possessing an opposite polarity of the first power transistor. The second power transistor is driven by a second gate driver, said controller being configured to adjust a level of a second modulated gate drive signal applied by the second gate driver between gate and source terminals of second power transistor based on the determined level of the audio signal.

The second gate driver may include the same features as the first gate driver such that the controller may be further configured to: select a first level of the second modulated gate drive signal if the level of the audio signal is smaller than the audio level threshold; and select a second level of the second modulated gate drive signal if the level of the audio signal is larger than the signal level threshold, wherein the second level is larger than the first level.

Since the polarities of the first and second power transistors are opposite their respective threshold voltages may exhibit poor tracking over semiconductor process variations and temperature changes. The accuracy of the estimate of the threshold voltage of the second power transistor can therefore be improved by exploiting a separate threshold detector for the second power transistor. According to the latter embodiment, the second gate driver comprises: a second threshold detector configured to estimate a threshold voltage of the second power transistor; and a second DC reference voltage configured to set the second level of the second modulated gate drive signal. The second gate driver may additionally comprise a second DC reference voltage generator configured to derive a third DC reference voltage from a difference between the second DC reference voltage and the estimated second threshold voltage. The second gate driver may also be configured to determining a predetermined fraction of the second overdrive voltage and adding the estimated threshold voltage of the second power transistor thereto to set a third DC reference voltage for setting the first level of the second modulated gate drive signal.

The plurality of power transistors of the output stage may at least comprise an additional power transistor, e.g. a third power transistor, of the same polarity as the first power transistor. The gate input of the additional power transistor is preferably driven by an additional modulated gate drive signal supplied by an additional gate driver of the amplifier. The controller may therefore be configured to adjust the level of the additional modulated gate drive signal, via the additional gate driver, based on the determined level of the audio signal. The skilled person will appreciate that the controller may be configured to adjust the level of the additional modulated gate drive signal in a corresponding manner to any of the previously discussed adjustment methods of the first modulated gate drive signal.

The output stage of the class D audio amplifier may comprise an upper leg and a lower leg electrically interconnected at a midpoint node; said midpoint node being connectable to a loudspeaker load. The upper and lower legs are forming a half-bridge driver. The upper leg may at least comprise the first power transistor and the lower leg at least comprises the second power transistor. In multilevel output stages, each of the upper and lower legs comprises two or more series connected, or stacked, power transistors as discussed in additional detail below with reference to the appended drawings. If the upper leg of the output stage comprises one or several N-type MOS transistors their respective gate drivers may have a power supply voltage connected to a separate high-side voltage supply which is generated by a voltage multiplier or charge pump. The voltage multiplier or charge pump may be configured to generate a high-side voltage which is between 2 V and 5 V higher the upper or first DC supply voltage (Pvdd).

The skilled person will appreciate that the entire class D audio amplifier, or at least all active devices thereof, may be formed or integrated on a semiconductor substrate such as CMOS or DMOS integrated circuit. The semiconductor substrate provides a robust and low-cost single chip class D audio amplifier which is particularly well-suited for high-volume, consumer-oriented audio applications, such as TV sets, mobile phones and MP3 players, where cost is an essential parameter.

A second aspect relates to a method of decreasing power consumption of an output stage of a class D audio amplifier by controlling an level of a modulated gate drive signal, said method comprising: applying an audio input signal to the class D audio amplifier; modulating the audio input signal to generate a modulated audio signal at a predetermined carrier or modulation frequency; determining a level of the audio signal; deriving, from the modulated audio signal, respective modulated gate drive voltages for a plurality of power transistors of the output stage to repeatedly switch the plurality of power transistors between respective conducting states and non-conducting states; and adjusting the level of at least a first modulated gate drive voltage based on the determined level of the audio signal such that the level of the first modulated gate voltage is larger for audio signal levels exceeding a signal level threshold than for audio signal levels below the signal level threshold.

The methodology may further comprise: selecting a second fixed level of the first modulated gate drive voltage for levels of the audio signal exceeding the audio level threshold; and selecting a first fixed level of the first modulated gate drive voltage for levels of the audio signal below the audio level threshold.

Those skilled in the art will recognize additional features and advantages upon reading the following detailed description, and upon viewing the accompanying drawings.

BRIEF DESCRIPTION OF THE DRAWINGS

Embodiments are described in more detail in connection with the appended drawings, in which.

DETAILED DESCRIPTION

Figure 1:
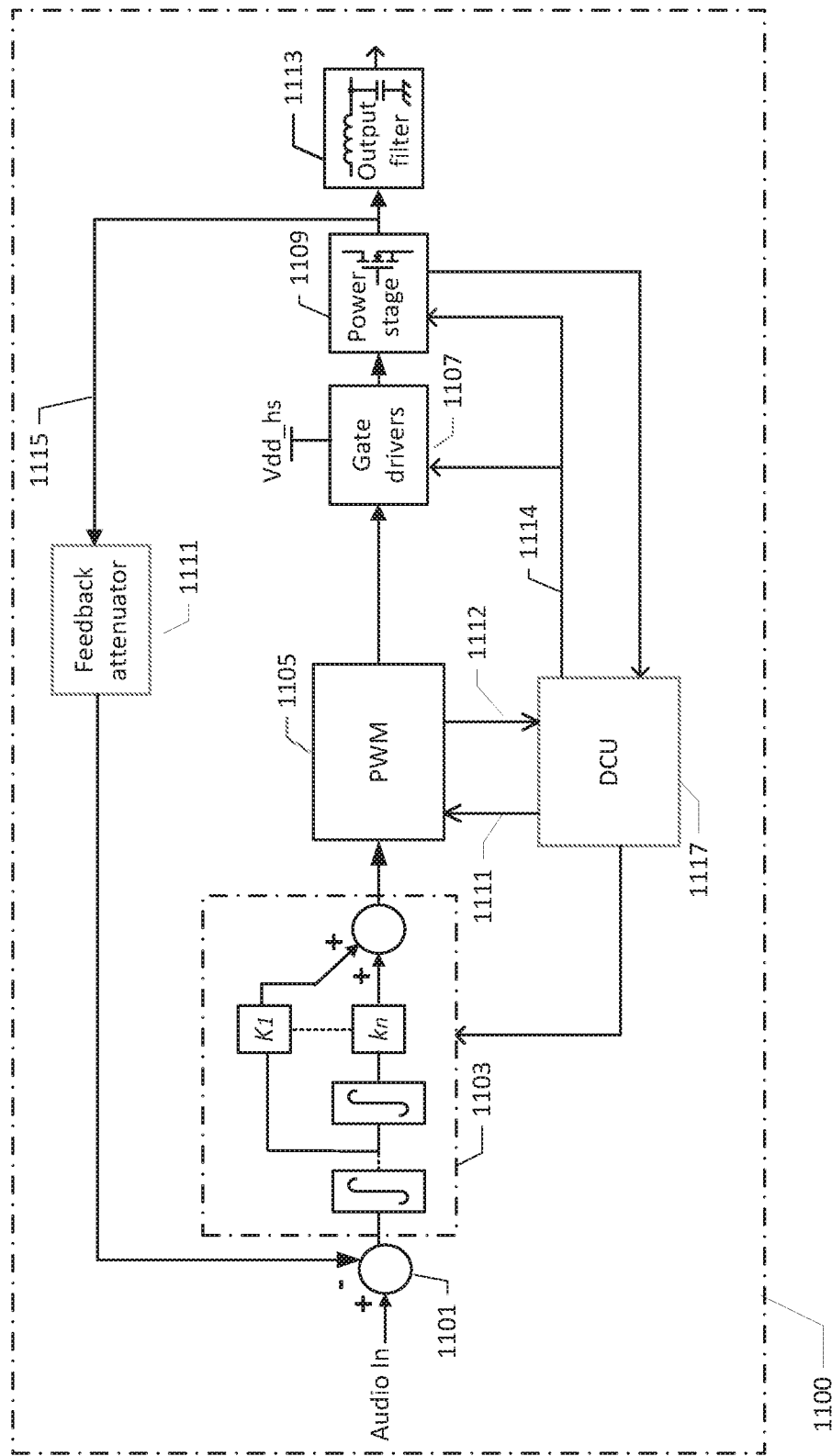
FIG. 1 illustrates schematically a class D audio amplifier with adjustable level of the modulated gate drive signals in accordance with an exemplary embodiment.
Figure 2A:
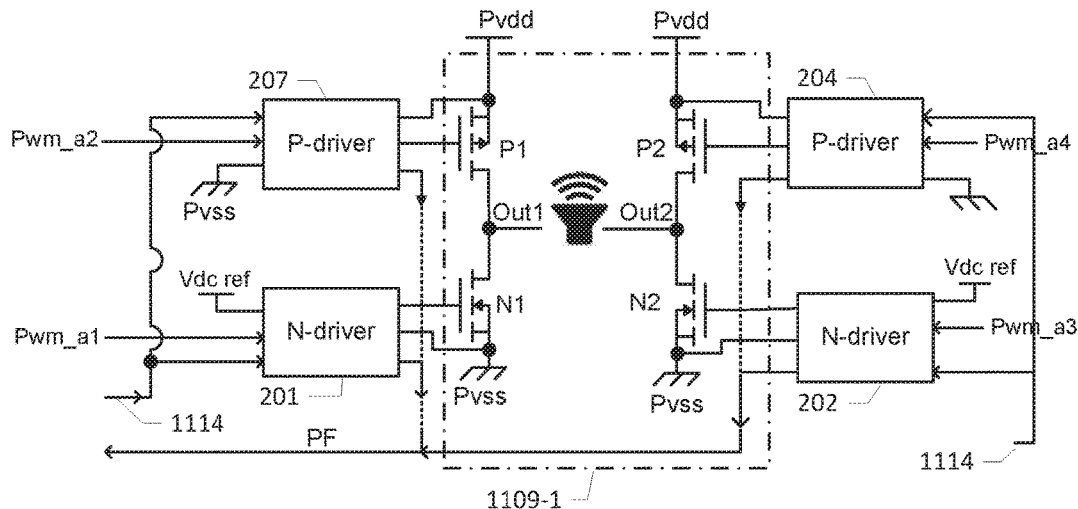
FIG. 2A illustrates an H-bridge output stage and associated gate drivers of a class D audio in accordance with a first embodiment.
Figure 2B:
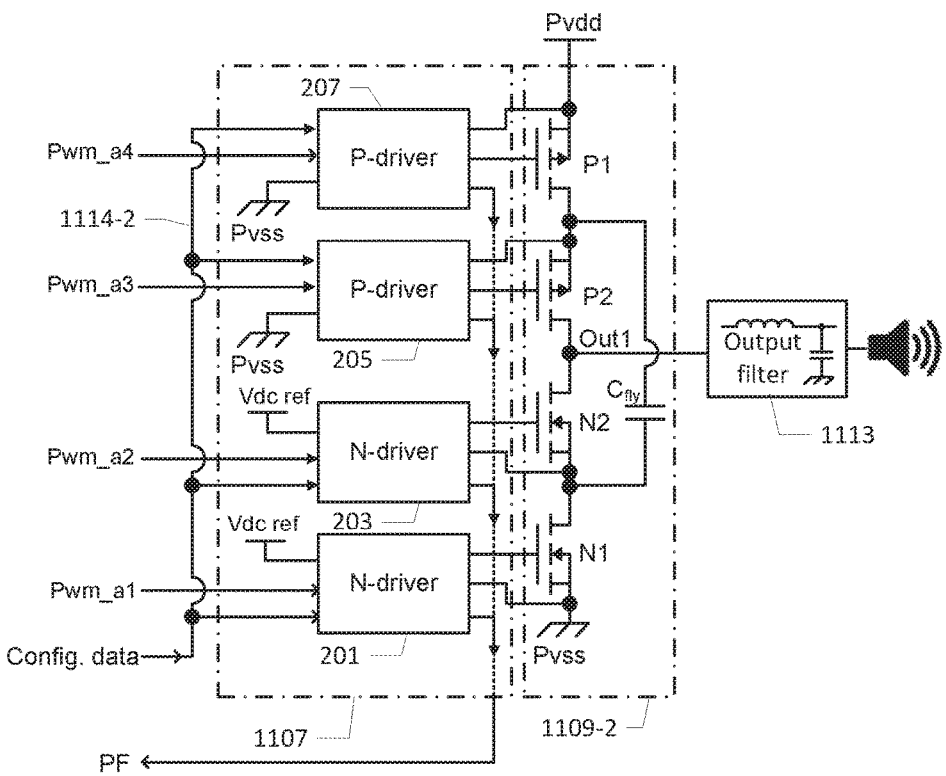
FIG. 2B illustrates a single ended multi-level output stage and associated gate drivers of a class D audio in accordance with a second embodiment.

FIG. 1 schematically illustrates a PWM based class D audio amplifier 1100 comprising a single-ended or a balanced/differential H-bridge output stage 1109, for example similar to a single ended multi-level output stage 401 depicted on FIG. 2B or the H-bridge output stage 1109 depicted on FIG. 2A in accordance with an exemplary embodiment. The present class D audio amplifier 1100 utilizes a sophisticated control of the respective levels or voltages of one or several modulated gate drive signal(s) of the power transistors of the output stage 1109 based on a detected level of the audio signal to reach power consumption reductions at small levels of the audio signal as discussed in additional detail below.

The class D audio amplifier 1100 comprises an input terminal or node for receipt of the audio input signal. The class D audio amplifier 1100 further comprises an analog summing node 1101 arranged in front of an adjustable loop filter 1103 for receipt of analog audio input signals at the Audio In node. A feedback signal 1115 is derived from the output voltage of the output stage 1109, prior to the optional output filter circuit 1113 and coupled to the summing node 1101 via a feedback attenuator 1111. The output voltage is subtracted from the analog audio input signal by the summing node 1101 to form an error signal or difference signal that is applied to an input of the fixed or adjustable loop filter 1103. The adjustable loop filter 1103 may possess numerous topologies and typically at least comprises one integrator or several cascaded integrators as schematically illustrated. The integrators are schematically illustrated in FIG. 1 by integrator symbols and respective gain coefficients, $k_1$-$k_n$, that are operative to lowpass filter the error signal before transmission to a modulator 1105. The modulator 1105 is configured for receipt of the lowpass filtered audio signal supplied at the output of the loop filter 1103 and converting this audio signal into a modulated audio signal at a predetermined carrier or modulation frequency. The modulator 1105 may for example comprise an analog or digital pulse width modulator (PWM) circuit or an analog or digital pulse density modulator circuit (PDM). The modulation or carrier frequency of the PWM modulator 1105 may be controlled by a clock circuit 1121, e.g. arranged within the controller 11117, which generates synchronization pulses to the modulator 1105. The class D audio amplifier may include an adjustable PWM modulation frequency which may be switched between a number of pre-set values for example 150 kHz, 300 kHz and 600 kHz for high levels, medium levels and low levels, respectively, of the audio input signal. The maximum setting of the modulation frequency may lie between 300 kHz and 5 MHz in a number of useful embodiments.

The class D audio amplifier 1100 comprises a gate drive circuit or block 1107 which comprises a plurality of individual gate drivers having respective inputs coupled directly or indirectly to the modulated audio signal supplied by the modulator 1105. The modulator 1105 may be configured to derive multiple phases of the modulated audio signal and supply these phases to respective ones of the plurality of gate drivers to set a desired phase-relationship between the modulated gate drive signals of the plurality of power transistors. The modulated gate drive signals are applied to respective ones of a plurality of power or output transistors of the output stage 1109 such that each power transistor is repeatedly switched between a conducting state and a non-conducting state in accordance with the modulated gate drive signal in question as discussed below. Some of the gate drivers may comprises level shifters in particular where the power transistor connected to output of the gate driver is arranged on a high-side of the output stage. A control circuit 1117 or controller of the class D audio amplifier 1100 is configured to determine a level of the audio signal and adjust the level of at least one of the modulated gate drive signals generated by at least one of the gate drivers based on the determined or detected level of the audio signal. The skilled person will appreciate that the control circuit 1117 may be configured to adjust levels all of the modulated gate drive signals generated by the plurality of gate drivers based on the determined or detected level of the audio signal. The control circuit 1117 may comprise a Digital Signal Processor (DSP) either in software programmable configuration or as dedicated computational hardware for example comprising a digital state machine, configured to provide the below described functions or operations in accordance with a set of executable program instructions or hardwired states.

The control circuit 1117 may be configured to determine the level of the audio signal in numerous ways. According to one embodiment, the control circuit monitors or detects a modulation index or modulation duty cycle of the modulated audio signal at the output, or internally in, the modulator 1105. This is schematically illustrated by the modulation monitoring signal 1112 running from the modulator 1105 to the controller 1117. In the alternative, the control circuit 1117 may determine the level of the audio signal by detecting the audio input signal at the input node, an internal node, or at the output of the power stage 1109. The latter detection may be carried out in the analog domain or digital domain and the level may be represented by a peak voltage, peak-peak voltage, average voltage RMS voltage etc. of the audio signal in question.

The control circuit 1117 additionally comprises a configuration data generator (not shown) connected via a configuration bus or wire 1114 to the gate driver circuit 1107 and the output stage 1109. The configuration data generator transmits specific configuration data to configuration receivers of the gate driver circuit 1107 to set various types of operational parameters of each of the plurality of gate drivers as discussed below. The configuration data generator may additionally be adapted to transmit specific configuration data to the output stage 1109 to set various types of operational parameters thereof such as an over-current protection limit, gate driver pull-up/down current level or various functions specific to manufacturing testing and/or adjustment.

FIG. 2A illustrates an H-bridge output stage 1109-1 and its associated gate drivers 201, 202, 203, 204 for respective ones of the power transistors N1, P1, N2, P2 of the H-bridge output stage 1109-1 of a class D audio in accordance with a first embodiment. A first half-bridge driver comprises an upper leg with a NLDMOS or NMOS transistor N1 and a lower leg with a PLDMOS or PMOS transistor P1 electrically interconnected at a midpoint node Out1. The NLDMOS and PLDMOS transistors P1, N1 are connected in cascade between a first DC supply voltage (Pvdd) and a second DC supply voltage (Pvss). Pvdd may be a positive DC voltage between 5 V and 40 V while Pvss may be ground (GND) or a negative DC supply voltage. The midpoint node Out1 is connectable to a first terminal of a loudspeaker load as schematically illustrated. The H-bridge output stage 1109-1 additionally comprises a second half-bridge driver which comprises an upper leg with a NLDMOS or NMOS transistor N2 and a lower leg with a PLDMOS or PMOS transistor P2 electrically interconnected at a second midpoint node Out2. The midpoint node Out2 is connectable to a second terminal of the loudspeaker load as schematically illustrated. The skilled person will understand that the corresponding components of the first half-bridge driver and second half-bridge driver may be nominally identical in some embodiments. The corresponding modulated gate drive signals, or gate drive voltages, supplied by the respective gate drivers 201, 202, 203, 204 for the gates of the power transistors N1, P1, N2, P2 may be complementary such that the output voltages at nodes Out1 and Out2 are switched in opposite phase. The previously discussed configuration data for each of the gate drivers 201, 202, 203, 204 are supplied through the configuration bus or wire 1114. The configuration data of each gate driver comprises voltage state or mode selecting the level of the modulated gate drive signal supplied to the interconnected power transistors. This data interface accordingly enables the previously discussed controller to adjust the level of the modulated gate drive signal between two or even more pre-set voltages—for example based on the level of the audio signal as discussed in additional detail below. A first DC reference voltage (Vdc_ref) is powering each of the gate drivers 201, 202 for the NMOS transistors N1, N2 and this first DC reference voltage may be identical to the first DC supply voltage (Pvdd) or a lower DC voltage derived therefrom. The first DC reference voltage is preferably sufficiently high to provide a suitable level or voltage of the respective modulated gate drive signals applied on the gates of the NMOS power transistors N1, N2 when the audio signal exceeds a signal level threshold. A high value of the first DC reference voltage provides a small on-resistance of the NMOS power transistors N1, N2 when they are switched on, i.e. in their conducting state. On the other hand, the first DC reference voltage should not exceed any specified maximum safe gate-source voltage of the power transistors. The skilled person will appreciate that the first DC reference voltage (Vdc_ref) for example may lie between 3 V and 6 V depending on dimensions and semiconductor characteristics of the NMOS power transistors N1, N2. Similar considerations apply for the gate drivers 204, 207 and their associated PMOS transistors P1, P2.

Pulse width modulated audio signals Pwm_a1, Pwm_a2, Pwm_a3 and Pwm_a4 are applied to respective signal inputs of the gate drivers 201, 202, 203, 204. These pulse width modulated audio signals Pwm_a1, Pwm_a2, Pwm_a3 and Pwm_a4 may be buffered and, possibly level-shifted, by the respective gate drivers as needed to generate modulated gate drive signals for respective ones of the gate inputs/terminals of the power transistors N1, P1, N2, P2 to appropriately switch each of the power transistors between on-states and off-states in accordance with the pulse width modulated audio signal in question.

FIG. 2B illustrates a single ended multi-level output stage 1109-2 and its associated gate drivers 201, 203, 205, 207 for respective ones of the power transistors N1, N2, P1, P2 of the output stage 1109-2 of a class D audio in accordance with a second embodiment. The multi-level output stage 1109-2 comprises a lower leg comprising the first and second NLDMOS or NMOS transistors N1, N2 and a lower leg comprising the first and second PLDMOS or PMOS transistors P1, P2. The upper and lower legs are electrically interconnected at a midpoint node Out1. The NLDMOS and PLDMOS transistors N1, N2, P1, P2 of the output stage are connected in cascade between a first DC supply voltage (Pvdd) and a second DC supply voltage (Pvss). Pvdd may be a positive DC voltage between 5 V and 40 V while Pvss may be ground (GND) or a negative DC supply voltage. A flying capacitor is connected between first and second intermediate nodes of the output stage and may be charged to a voltage of about one-half of Pvdd minus Pvss. The midpoint node Out1 is connectable to a first terminal of a loudspeaker load, possibly through the optional lowpass filter 1113, as schematically illustrated. The skilled person will appreciate that alternative embodiments of the multi-level output stage may comprise an H-bridge topology similar to the one discussed above. The skilled person will also understand that the NLDMOS N2 and its gate driver 203 are arranged on a high-side portion of the output stage and appropriate level shifters may be needed for driving gate-source terminals of N2. The skilled person will understand that corresponding components of the lower leg and gate drive circuits may be nominally identical in some embodiments. The corresponding modulated gate drive signals supplied by the respective gate drivers 201, 203, 205, 207 for the gates of the power transistors N1, N2 and, P1, P2 may be relatively phase shifted such that the output voltage at node Out1 is switched between three discrete voltage levels: Pvdd, 0.5 Pvdd and Pvss assuming that the latter is GND in the present embodiment. As discussed above configuration data for each of the gate drivers 201, 203, 205, 207 are supplied, or written, by the controller through the configuration bus or wire Config. data (1114-2). The configuration data of each gate driver comprises a state or mode information selecting the level of the modulated gate drive signal supplied to its interconnected power transistor. This data interface accordingly enables the previously discussed controller to adjust the level of the modulated gate drive voltage between two or even more pre-set voltages—for example based on the level of the audio signal as discussed in additional detail below.

Figure 3:
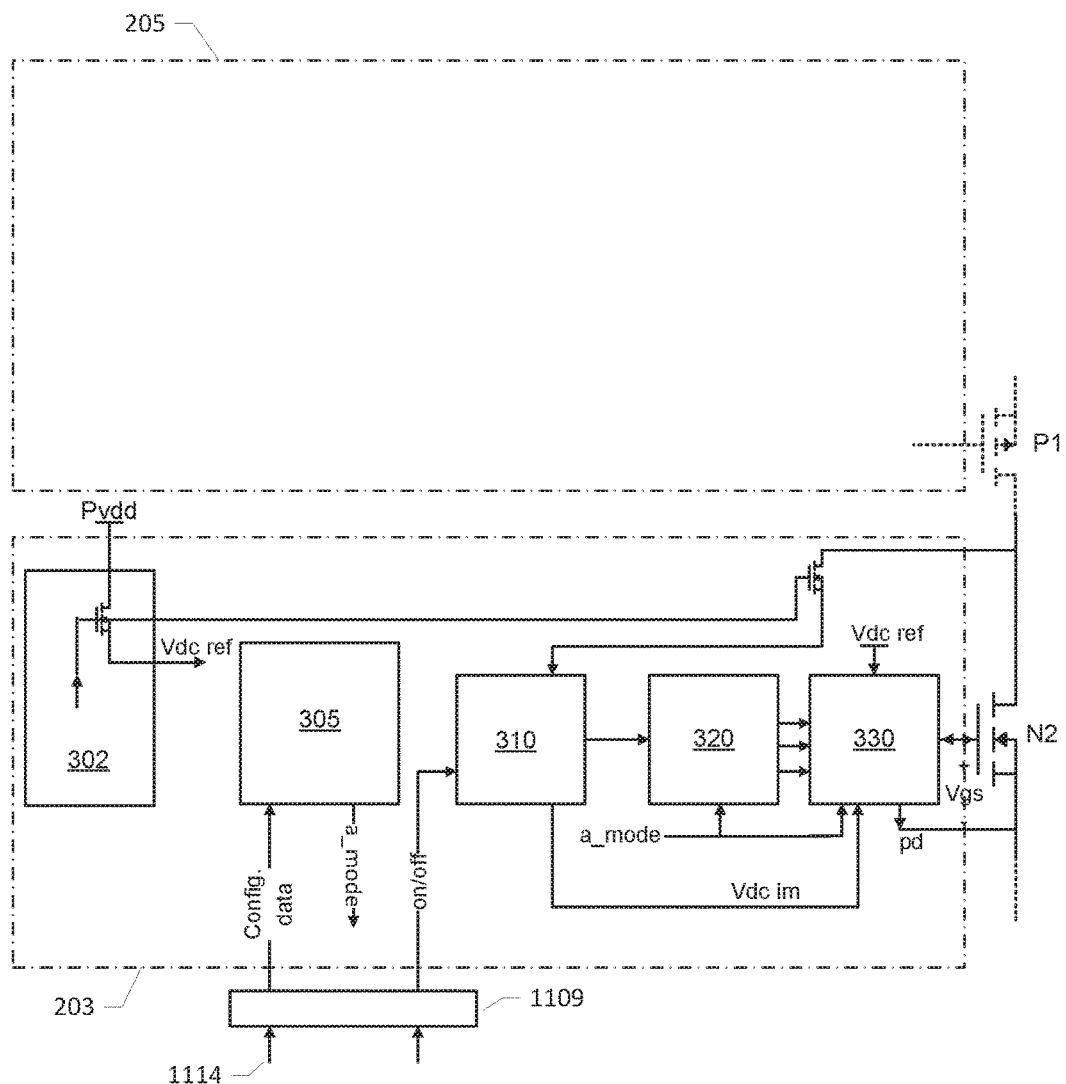
FIG. 3 is a simplified block diagram of an exemplary gate driver for application in a class D audio amplifier depicted on FIG. 1.

FIG. 3 is a simplified block diagram of an exemplary embodiment of the previously discussed gate driver 203 or driver circuit for the high-side LDNMOS transistor N2. The gate driver 203 comprises a linear regulator 302 configured to derive the previously discussed first DC reference voltage (Vdc_ref) from the first or positive DC supply voltage Pvdd. The linear regulator 302 may comprise an output voltage control loop establishing, via a suitable reference voltage or current, a fixed and stable level of the first DC reference voltage despite variations of the positive DC supply voltage Pvdd. The gate driver 203 comprises a configuration receiver 305 coupled to the controller through a level translator circuit 1109 for reception of the configuration data through data bus 1114 volatile or non-volatile storage of various type of configuration data of the gate driver 203. The configuration receiver 305 reads and stores the level mode bit or control signal selecting the level or voltage of the modulated gate drive signal supplied to the interconnected power transistor. The configuration receiver 305 transmits the level mode bit or setting to the gate resource circuit 330 via a wire or line a_mode where the state is applied to select the proper voltage as discussed in additional detail below. The gate driver 203 comprises a drive resource circuit 320 which interfaces to the gate resource circuit 330 to control the operation of various hardware components therein. The gate driver 203 may comprise an optional over-current protection circuit 310 which is configured to monitor and limit current through the power transistor N2 to prevent overcurrent and/or overvoltage destruction.

Figure 4:
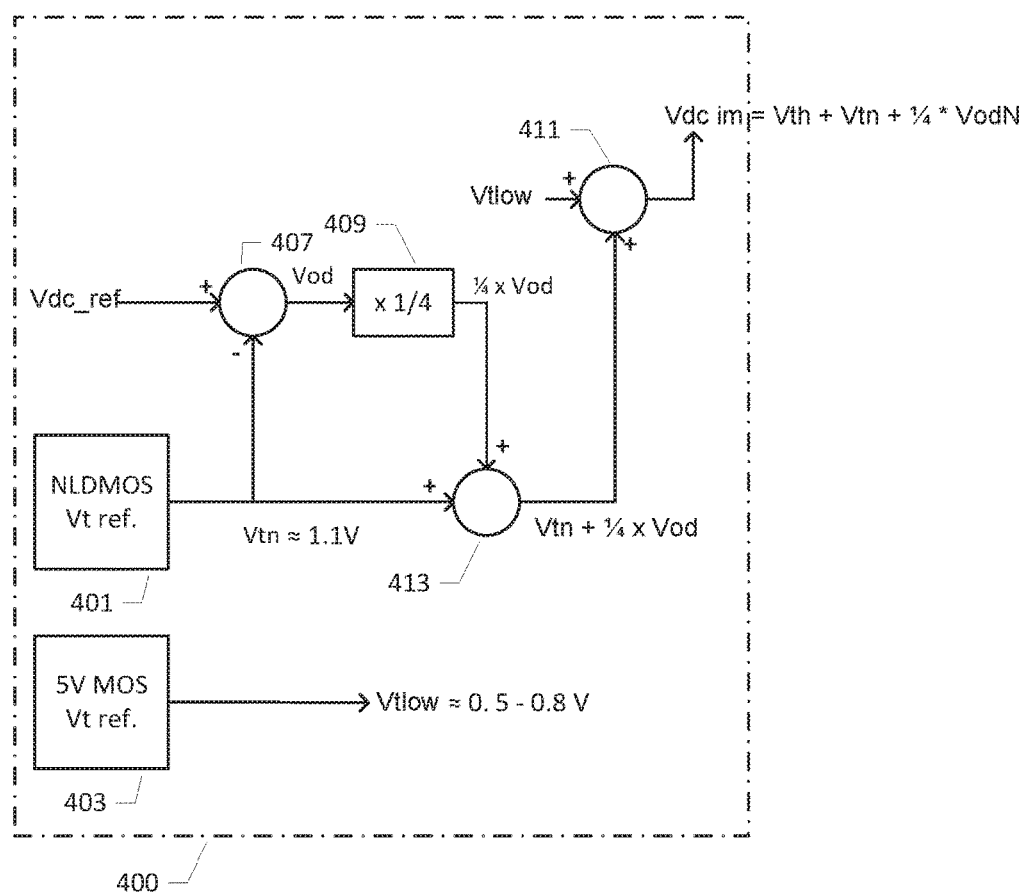
FIG. 4 is a simplified block diagram of a DC reference voltage generator of the exemplary gate driver.

FIG. 4 is a simplified block diagram of the functionality of first and second threshold detectors 401, 403 and a first DC reference voltage generator 400 of the exemplary gate driver 203 discussed above. Each of the previously discussed gate drivers 201, 203, 205, 207 may include a dedicated DC reference voltage generator 400 or a single DC reference voltage generator 400 may be shared by several gate drivers depending on the topology of the output stage. The present embodiment of the DC reference voltage generator 400 also comprises a low-voltage NMOS transistor Nd1 of the programmable inverter circuit shown on FIG. 5A. The first DC reference voltage Vdc_ref may be generated externally and applied to a first input of a summer 407 of the DC reference voltage generator 400. The DC reference voltage generator 400 is configured to derive a second DC reference voltage from a difference between the first DC reference voltage Vdc_ref and the estimated threshold voltage of the power transistor N2. This second DC reference voltage sets the first level of the first modulated gate drive signal applied to the gate terminal of N2 at small levels of the audio signal. The DC reference voltage generator 400 comprises a first threshold detector 401 which is configured to estimate a threshold voltage of the power transistor N2. N2 may be a MOS device, DMOS device or IGBT device of N type e.g. an NLDMOS device. The first threshold detector 401 comprises a test transistor of the same type as the power transistor N2 to ensure that electrical characteristics, in particular the threshold voltages, of the power transistor and the test transistor are tracking over semiconductor process variations and operational temperature changes. The power transistor N2 and test transistor may for example be arranged in physical proximity on a common semiconductor substrate holding the gate driver to improve device tracking despite the dimensions of the power transistor N2 are significantly larger than those of the test transistor. The test transistor may be diode-coupled and a test generator (not shown) may be configured to intermittently, or continuously during operation of the class D amplifier, apply a pre-set test current to the test transistor e.g. flowing between the drain-source terminals or nodes of the test transistor. The test current may be between 1 μA and 100 μA—for example 2-3 μA to minimize power consumption. The threshold detector 401 finally outputs the measured threshold voltage Vtn of the test transistor as an estimate of the actual threshold voltage of the first power transistor N2. The measured threshold voltage Vtn may lie between 0.9 V and 1.3 V such as about 1.1 V as indicated on the drawing. The intermittent operation of the test current generator will lead to considerable power savings in the first threshold detector 401 if the active or operational time period is markedly shorter than the inactive time period during operation of the class D audio amplifier.

The DC reference voltage generator 400 additionally comprises an optional second threshold detector 403 which is configured to estimate a threshold voltage of a typical low-voltage MOS transistor of the gate driver which may be an ordinary or low-voltage NMOS device or an ordinary or low-voltage PMOS device. The threshold detector 403 may comprise a test transistor of the same type as the typical low voltage transistor to ensure that electrical characteristics, in particular the threshold voltages, of the test transistor and low-voltage transistor are tracking over semiconductor process variations and operational temperature changes. The second threshold detector 403 may otherwise operate in a similar manner to the first threshold detector 401 discussed above to estimate the threshold voltage Vtlow of the typical low voltage transistor.

The DC reference voltage generator 400 comprises a first subtractor 407 which subtracts Vdc_ref and the estimated threshold voltage Vtn of the power transistor N2 to determine an overdrive voltage Vod. The overdrive voltage Vod is an estimate of how much the gate voltage of M2 exceeds its threshold voltage when the gate voltage equals the first DC reference voltage. A predetermined fraction, for example between one-third and one-fifth such as one-fourth as illustrated, of this overdrive voltage Vod is computed or determined by a division circuit 409 and the fractional overdrive voltage transmitted to a second summer of summing circuit 413. The division circuit 409 may for example comprise a switched capacitor divider. The summer 413 adds the predetermined fraction of Vod to the estimated threshold voltage Vtn to provide a threshold compensated overdrive voltage Vtn+¼ Vod at the output of the sum circuit. The estimated threshold voltage Vtlow of the typical low voltage transistor, e.g. between 0.5 and 0.8 V. is added to the threshold compensated overdrive voltage Vtn+¼ Vod by a third summing circuit 411 to provide an intermediate dc voltage Vdc_im. The intermediate dc voltage Vdc_im is conveyed or transmitted to the gate resource circuit 330 that supplies the modulated gate drive signal to the power transistor N2.

Figure 5A:
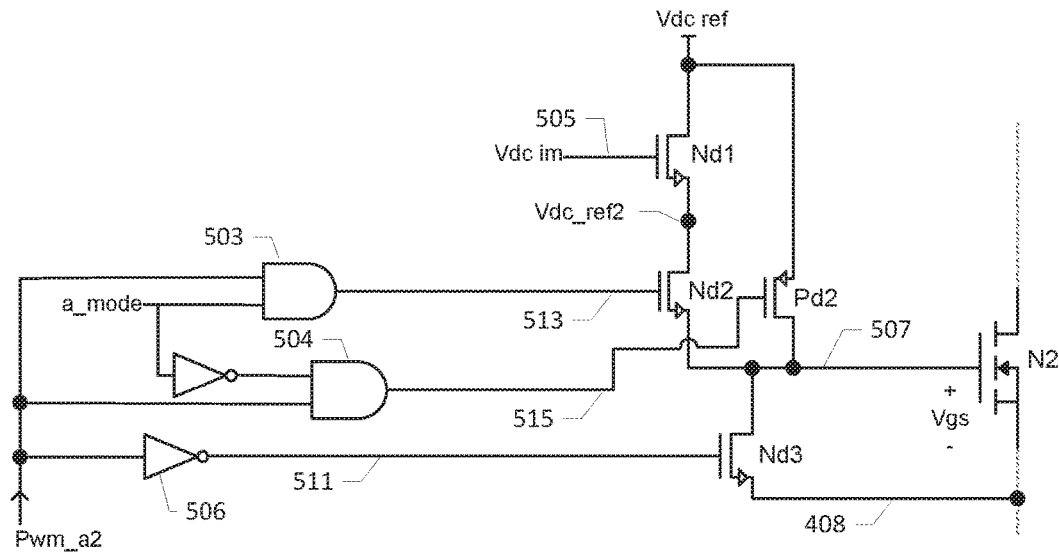
FIGS. 5A, 5B, and 5C show respective transistor level diagrams of a gate resource circuit of the exemplary gate driver.

FIG. 5A shows a transistor level diagram of the gate resource circuit 330 of the exemplary gate driver connected to, and driving, the gate input of the power transistor N2. The gate resource circuit 330 comprises an inverter with programmable or selectable power supply voltage and likewise selectable output drive voltage. The drive voltage programmable inverter comprises low-voltage NMOS transistors Nd2, Nd3 and a low-voltage PMOS transistor Pd2 while the previously discussed low-voltage NMOS transistor Nd1 can be viewed as part of the DC reference voltage generator 400. The output node or terminal 507 of the programmable inverter is coupled to the gate input or terminal of the power transistor N2 while the lower supply voltage of the programmable inverter is connected to the source terminal 508 of the power transistor N2. Hence, the gate-source voltage of N2 is set by the selectable output drive voltage of the programmable inverter. The controller can, using the a_mode bit or signal, switch the upper or positive DC supply voltage of the programmable inverter between the first DC reference voltage Vdc_ref. which is connected to the drain of Nd1, and a second DC reference voltage Vdc_ref2 which largely corresponds to the threshold compensated overdrive voltage Vtn+¼ Vod generated by the DC reference voltage generator 400. The second DC reference voltage, at the source terminal of Nd1, is approximately equal to Vtn+¼ Vod, because the intermediate dc voltage Vdc_im is one threshold voltage Vtlow larger than Vtn+¼ Vod as set by the previously discussed action of the summer 411 of the DC reference voltage generator 400. The voltage at source of Nd1 is one threshold voltage Vtlow lower than the intermediate dc voltage Vdc_im, because Vtlow is an estimate of the actual gate-source voltage drop across the low-voltage NMOS transistor Nd1. Consequently, the source voltage of Nd1 is substantially equal to the threshold compensated overdrive voltage Vtn+¼ Vod. Furthermore, the low-output impedance at the source of Nd1 makes the source voltage well-suited to provide the second DC reference voltage of the programmable inverter with a lower voltage than Vdc_ref.

When the a_mode bit or signal is set to logic 0, the pull-up transistor Nd2 is switched off rendering the pull-up path to the second DC reference voltage (Vtn+¼ Vod) inactive, while the alternative pull-up path through transistor Pd2 is switched on pulling the output node 507 of the programmable inverter to the highest supply voltage supplied by the first DC reference voltage Vdc_ref. Consequently, the modulated gate drive voltage applied across the gate and source terminals of N2 has a peak-to-peak voltage equal to the first DC reference voltage Vdc_ref. The first DC reference voltage Vdc_ref may lie between 3 V and 6 V such as about 5V.

Figure 5B:
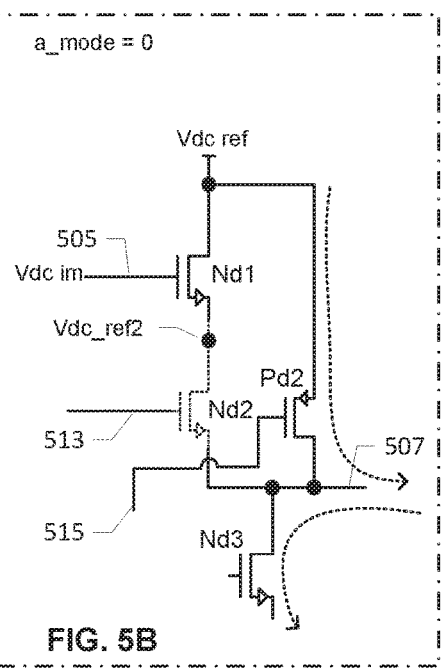

The equivalent electrical diagram on FIG. 5B illustrates the state of the programmable inverter when the a_mode bit is set to logic 0. The output node 507 of the programmable inverter is alternatingly pulled to Vdc_ref, by the conducting pull-up transistor Pd2, and pulled to down the lower DC supply voltage of the programmable inverter, at the source terminal 508 of N2, by NMOS transistor Nd3. Pd2 and Nd3 are operated in opposite phase by the modulated audio signal Pwm_a2 that is applied in inverted format to the gate input of Nd3 and to the gate input of Pd2 through AND gate 504 and through wire 515.

Figure 5C:
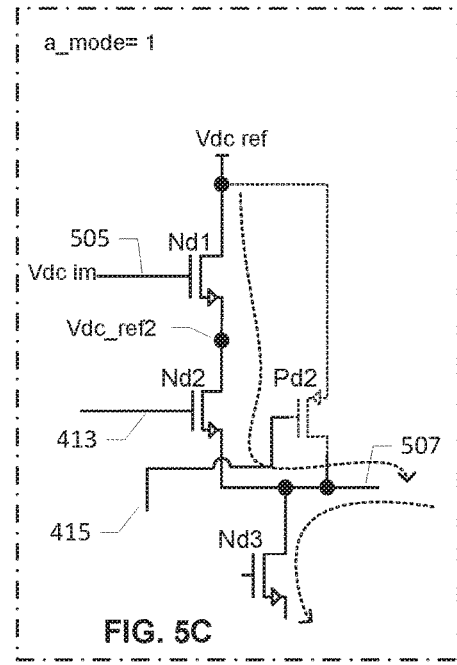

The skilled person will understand that the relatively large voltage, and hence level, of the modulated gate drive signal in this "high voltage mode", a_mode=0, is advantageous at high audio signal levels, e.g. above the previously discussed signal level threshold, because the large level of the gate drive voltage leads to small on-resistance of power transistor N2. This small on-resistance reduces resistive power dissipation in N2 and increases power dissipation in the loudspeaker load. When the controller programs the a_mode bit to logic 1, the pull-up transistor Nd2 is switched on, i.e. conducting, such that the pull-up path to the second DC reference voltage (Vtn+¼ Vod) is conducting while the alternative pull-up path through PMOS transistor Pd2 is now switched off to disconnect the pull-up path to the first DC reference voltage Vdc_ref. Consequently, the voltage of the modulated gate drive signal applied across the gate and source terminals of the power transistor N2 is now equal to the threshold compensated overdrive voltage Vtn+¼ Vod. The equivalent electrical diagram on FIG. 5C illustrates the state of the programmable inverter when the a_mode bit is set to logic 1. The output node 507 of the programmable inverter is alternatingly pulled to Vtn+¼ Vod, by the conducting state of the NMOS pull-up transistor Nd1, and pulled to down the lower supply voltage of the programmable inverter, at the source terminal 508, by the NMOS transistor Nd3. Nd2 and Nd3 are active or conducting in opposite phases of the modulated audio signal Pwm_a2 due to the inverter 506.

Hence, the modulated gate drive voltage across the gate and source of N2 has a peak-to-peak voltage corresponding to Vtn+¼ Vod. If the first DC reference voltage Vdc_ref is selected to 5.1 V and Vtn is estimated to 1.1 V, the threshold compensated overdrive voltage Vtn+¼ Vod may be set to 2.1 V in the present embodiment. The skilled person will understand that the relatively small voltage of the modulated gate drive signal under these low voltage drive conditions is advantageous under operating conditions of the class D amplifier where the audio level is relatively small, e.g. at or below the previously discussed signal level threshold. This is because the parasitic charging losses associated with the repeated charging and discharging of the considerable gate capacitance of the power transistor N2 are significantly reduced, compared to the high voltage drive, due to the reduced gate source voltage swing of the power transistor M2 charging and discharging its gate capacitance. Even though the on-resistance of the power transistor N2 is increased, e.g. approximately with the reciprocal of the fraction of the overdrive voltage, e.g. ¼ Vod, compared to the high voltage drive condition, the corresponding increase of the resistive power dissipation in N2 is relatively insignificant. This is because the output current through N2, like the actual power dissipation in the loudspeaker load, is small due to the low level of the audio signal.

Finally, the skilled person will appreciate that all four, eight or even more gate drivers of the output stage of the class D audio amplifier, e.g. the exemplary output stage embodiments illustrated on FIGS. 2A) and 2B) may be operated in a corresponding manner using programmable voltages of the respective modulated gate drive signals. Consequently, the above-discussed power savings are multiplied and leads to an even larger reduction of the power dissipation of the output stage of the class D audio amplifier at small audio signal levels and quiescent operation.

As used herein, the terms "having", "containing", "including", "comprising" and the like are open ended terms that indicate the presence of stated elements or features, but do not preclude additional elements or features. The articles "a", and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A class D audio amplifier, comprising:
   an input node or terminal configured to receive an audio signal;
   a modulator configured to receive the audio signal and convert the audio signal into a modulated audio signal having a predetermined carrier or modulation frequency;
   an output stage comprising a plurality of power transistors coupled in cascade between a first DC supply voltage and a second DC supply voltage;
   a plurality of gate drivers comprising respective inputs coupled to the modulated audio signal and configured to generate respective modulated gate drive signals to the plurality of power transistors for repeatedly switching each power transistor between a conducting state and a non-conducting state; and
   a controller configured to determine a level of the audio signal and adjust a level of a first modulated gate drive signal of a first power transistor of the output stage based on the determined level of the audio signal.

2. The class D audio amplifier of claim 1, wherein the controller is configured to increase the level of the first modulated gate drive signal with increasing level of the audio signal.

3. The class D audio amplifier of claim 2, wherein the controller is configured to stepwise increase, or gradually increase, the level of the first modulated gate drive signal with increasing level of the audio signal.

4. The class D audio amplifier of claim 2, wherein the controller is configured to: compare the determined level of the audio signal to a signal level threshold; and select a first level of the first modulated gate drive signal if the level of the audio signal is smaller than the signal level threshold, or select a second level of the first modulated gate drive signal if the level of the audio signal is larger than the signal level threshold, wherein the second level is larger than the first level.

5. The class D audio amplifier of claim 1, wherein a first one of the gate drivers comprises: a first DC reference voltage configured to set a second level of the first modulated gate drive signal; a first DC reference voltage generator comprising a first threshold detector configured to estimate a threshold voltage of the first power transistor and derive a second DC reference voltage from a difference between the first DC reference voltage and the estimated threshold voltage.

6. The class D audio amplifier of claim 5, wherein the first DC reference voltage generator is configured to: estimate a first overdrive voltage of the first power transistor from the difference between the first DC reference voltage and the estimated threshold voltage; determine a predetermined fraction of the first overdrive voltage and add the estimated threshold voltage of the first power transistor; and derive the second DC reference voltage from the predetermined fraction of the first overdrive voltage and the estimated threshold voltage.

7. The class D audio amplifier of claim 5, wherein the first threshold detector comprises a test transistor of a same type as the first power transistor, the first threshold detector being configured to: intermittently, or continuously, apply a test current to a diode-coupled test transistor; and estimate the threshold voltage of the first power transistor from a voltage drop across the diode-coupled test transistor.

8. The class D audio amplifier of claim 7, wherein the first threshold detector is configured to store the voltage drop across the test transistor on a capacitive element, or sample and encode the voltage drop via an analogue-to-digital converter.

9. The class D audio amplifier of claim 5, wherein the first gate driver comprises a first inverter or buffer connected between gate and source terminals of the first power transistor and configured to apply the first modulated gate drive signal to the first power transistor, and wherein a supply voltage input of the first inverter or buffer is selectively connectable to the first DC reference voltage and second DC reference voltage in accordance with a mode control signal.

10. The class D audio amplifier of claim 1, wherein the plurality of power transistors comprises a second power transistor having an opposite polarity of the first power transistor, and driven by a second gate driver, and wherein the controller is configured to adjust a level of a second modulated gate drive signal applied by the second gate driver between gate and source terminals of the second power transistor based on the determined level of the audio signal.

11. The class D audio amplifier of claim 10, wherein the controller is configured to select a first level of the second modulated gate drive signal if the level of the audio signal is smaller than an audio level threshold, and select a second level of the second modulated gate drive signal if the level of the audio signal is larger than the audio level threshold; wherein the second level is larger than the first level.

12. The class D audio amplifier of claim 11, wherein the second gate driver comprises: a second threshold detector configured to estimate a threshold voltage of the second power transistor; a second DC reference voltage configured to set the second level of the second modulated gate drive signal; and a second DC reference voltage generator configured to derive a third DC reference voltage from a difference between the second DC reference voltage and the estimated second threshold voltage.

13. The class D audio amplifier of claim 12, wherein the second DC reference voltage generator is configured to determine a predetermined fraction of a second overdrive voltage and add the estimated threshold voltage of the second power transistor thereto to set the third DC reference voltage for setting the first level of the second modulated gate drive signal.

14. The class D audio amplifier of claim 1, wherein the plurality of power transistors comprises an additional power transistor of a same polarity as the first power transistor, and wherein the controller is configured to adjust a level of an additional modulated gate drive signal of the additional power transistor based on the determined level of the audio signal.

15. The class D audio amplifier of claim 1, wherein the output stage comprises an upper leg and a lower leg electrically interconnected at a midpoint node, and wherein the midpoint node is configured for connection to a loudspeaker load.

16. A method of decreasing power consumption of an output stage of a class D audio amplifier, the method comprising:
applying an audio input signal to the class D audio amplifier;
modulating the audio input signal to generate a modulated audio signal at a predetermined carrier or modulation frequency;
determining a level of the audio signal;
deriving, from the modulated audio signal, respective modulated gate drive signals for a plurality of power transistors of the output stage to repeatedly switch the plurality of power transistors between respective conducting states and non-conducting states; and
adjusting the level of at least a first modulated gate drive voltage based on the determined level of the audio signal such that the level of the first modulated gate drive voltage is larger for audio signal levels exceeding a signal level threshold than for audio signal levels below the signal level threshold.

17. The method of claim 16, further comprising:
selecting a second fixed level of the first modulated gate drive voltage for levels of the audio signal exceeding the audio level threshold; and
selecting a first fixed level of the first modulated gate drive voltage for levels of the audio signal below the audio level threshold.

18. The method of claim 16, wherein adjusting the level of at least the first modulated gate drive voltage based on the determined level of the audio signal comprises:
stepwise or gradually increasing the level of the first modulated gate drive signal with increasing level of the audio signal.

19. The method of claim 16, wherein adjusting the level of at least the first modulated gate drive voltage based on the determined level of the audio signal comprises:
comparing the determined level of the audio signal to the signal level threshold; and
selecting a first level of the first modulated gate drive signal if the level of the audio signal is smaller than the signal level threshold, or a second level of the first modulated gate drive signal if the level of the audio signal is larger than the signal level threshold,
wherein the second level is larger than the first level.

20. The method of claim 19, further comprising:
setting the second level of the first modulated gate drive signal by a second DC reference voltage generator; and
estimating a threshold voltage of a first one of the power transistors and deriving a second DC reference voltage from a difference between a first DC reference voltage and the estimated threshold voltage, by a first DC reference voltage generator.

* * * * *